United States Patent [19]

Okihara et al.

[11] Patent Number: 4,985,644
[45] Date of Patent: Jan. 15, 1991

[54] OUTPUT BUFFER SEMICONDUCTOR AND METHOD FOR CONTROLLING CURRENT FLOW IN AN OUTPUT SWITCHING DEVICE

[75] Inventors: Yoshihiko Okihara; Yutaka Arita, both of Hyogo, Japan

[73] Assignee: Mitsubishi Denki Kabushiki Kaisha, Tokyo, Japan

[21] Appl. No.: 274,438

[22] Filed: Nov. 22, 1988

[30] Foreign Application Priority Data

Nov. 26, 1987 [JP] Japan .............................. 62-300556

[51] Int. Cl.$^5$ ............................................. H03K 17/16
[52] U.S. Cl. ...................................... 307/443; 307/448; 307/542; 307/546; 307/572; 365/189.05
[58] Field of Search ............... 307/254, 443, 448, 473, 307/542, 572, 263, 546; 365/189.05, 230.08

[56] References Cited

U.S. PATENT DOCUMENTS

| 4,347,447 | 8/1982 | Proebsting | 307/443 |
| 4,612,457 | 9/1988 | Prater | 307/443 |
| 4,638,187 | 1/1987 | Boler et al. | 307/443 |
| 4,653,027 | 3/1987 | Baba et al. | 365/189.05 |
| 4,716,550 | 12/1987 | Flannagan et al. | 365/230.08 |
| 4,731,553 | 3/1988 | Van Lehn et al. | 307/443 |
| 4,782,250 | 11/1989 | Adams et al. | 307/473 |
| 4,829,199 | 5/1989 | Prater | 307/443 |
| 4,837,458 | 6/1989 | Kawahata et al. | 307/443 |
| 4,845,681 | 7/1989 | Vu et al. | 365/189.05 |

Primary Examiner—Stanley D. Miller
Assistant Examiner—T. Cunningham
Attorney, Agent, or Firm—Lowe, Price, LeBlanc, Becker & Shur

[57] ABSTRACT

An output buffer circuit comprises a NAND circuit and a NOR circuit each receiving an output a of a signal source and an output b of an output control circuit and an output driving circuit formed by a p channel MOS transistor and an n channel MOS transistor receiving outputs of the NAND circuit and the NOR circuit. Large output capacitance is connected to an output of the output driving circuit. The n channel MOS transistor is connected between the output of the NOR circuit and a ground potential, and has its gate receiving the output of the output driving circuit. When the output of the output driving circuit is at an "H" level, the rise of the output of the NOR circuit is controlled, so that the output of the output driving circuit is first changed to the "L" level slowly. Therefore, discharge current from the output capacitance rises slowly. However, since transconductance of the n channel MOS transistor in the output driving circuit is set large, the output of the output driving circuit falls rapidly from halfway.

14 Claims, 8 Drawing Sheets

OUTPUT BUFFER SEMICONDUCTOR AND METHOD FOR CONTROLLING CURRENT FLOW IN AN OUTPUT SWITCHING DEVICE

BACKGROUND OF THE INVENTION

1. Field of the Invention

The present invention generally relates to semiconductor devices and more particularly, to output buffer circuits for such devices and operating method therefor in which output noise is reduced without delaying the output data therefrom.

2. Description of the Prior Art

Recently, semiconductor devices have been significantly developed. In various semiconductor devices, still higher operating speed and more stabilized operation are achieved.

Figure 1:
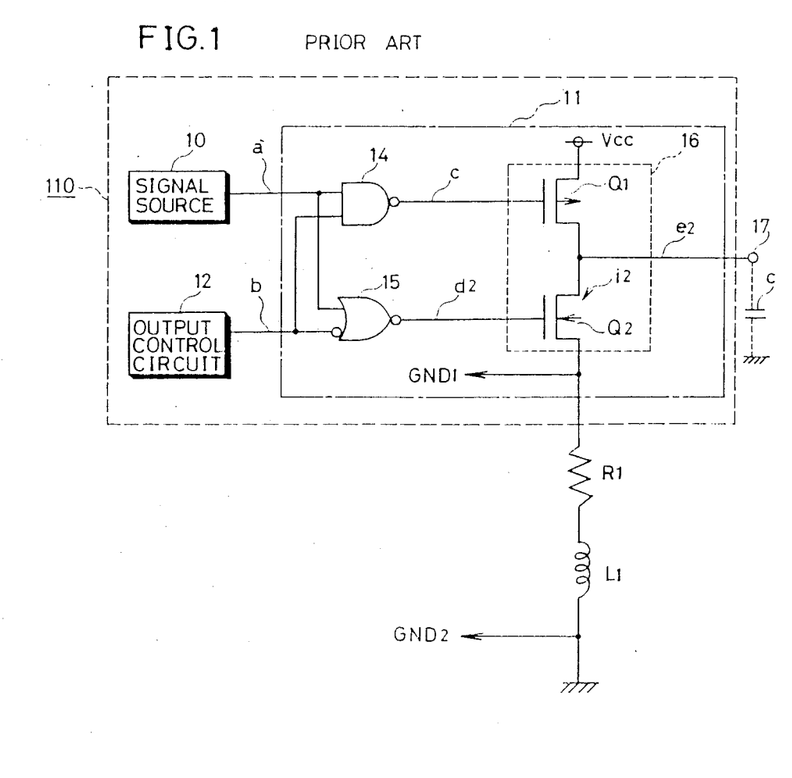
FIG. 1 is a circuit diagram showing a conventional output buffer circuit.

FIG. 1 is a circuit diagram showing an example of a conventional output buffer circuit in a semiconductor device. Such an output buffer circuit is provided in every kind of semiconductor integrated circuit, for example, a dynamic RAM, and generally serves to output an internal signal of such a semiconductor integrated circuit. In a semiconductor device 110 shown in FIG. 1, a conventional output buffer circuit 11 comprises a NAND circuit 14 receiving, as inputs, a signal a supplied from a signal source 10 and a signal b supplied from an output control circuit 12, a NOR circuit 15 receiving, as inputs, the signal a of the signal source 10 and the inverted value of the signal b of the output control circuit 12, an output driving circuit 16 and an output terminal 17.

More specifically, the output driving circuit 16 comprises a p channel MOS transistor Q1 having its source connected to a power-supply voltage $V_{CC}$, its drain connected to the output terminal 17 and its gate connected to an output of the NAND circuit 14 and an n channel MOS transistor Q2 having its source connected to a ground potential GND1, its drain connected to the output terminal 17 and its gate connected to an output of the NOR circuit 15. When the semiconductor device 110 is actually used, the output terminal 17 is parasitically connected to large output capacitance or substrate capacitance C comprising interconnection capacitance of the substrate, input capacitance to another device, and the like, as represented by a broken line in FIG. 1. Such substrate capacitance C is also subjected to the effect of radiation. Thus, the p channel MOS transistor Q1 and the n channel MOS transistor Q2 must drive such large output capacitance C at a high speed, so that transconductance of the MOS transistors is set very large. More specifically, the actual size w of the p channel MOS transistor Q1 may be approximately 300 μm while that of the n channel MOS transistor Q2 may be approximately 230 μm.

In addition, there exists a resistance component $R_1$ and an inductance component $L_1$ between the ground potential GND1 in the semiconductor device 110 and a ground potential GND2 in a system in which the semiconductor device 110 is incorporated, caused by leads of the semiconductor device itself and external interconnections.

Figure 2:
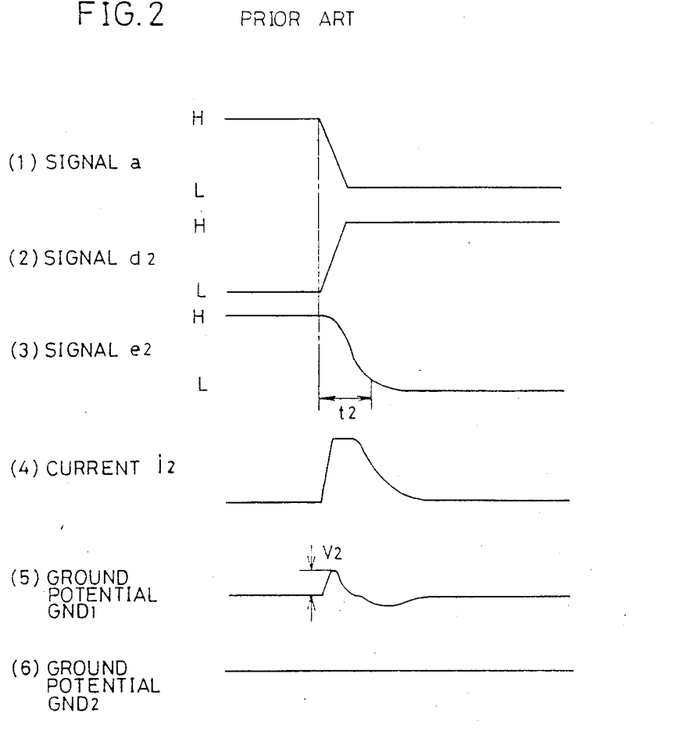
FIG. 2 is a waveform diagram for explaining an operation of the output buffer circuit shown in FIG. 1.

FIG. 2 is a waveform diagram for explaining an operation of the conventional output buffer circuit 11 shown in FIG. 1.

It is assumed that the output signal b of the output control circuit 12 is at an "L" level. In this case, if the output signal a of the signal source 10 is at an "H" level, an output signal c of the NAND circuit 14 attains the "H" level, so that the p channel MOS transistor Q1 is turned off. In addition, an output signal $d_2$ of the NOR circuit 15 attains the "L" level, so that the n channel MOS transistor Q2 is also turned off. On the other hand, if the output signal a of the signal source 10 is at the "L" level, the output signals c and $d_2$ attain "H" and "L" levels, respectively, so that both the MOS transistors Q1 and Q2 are turned off. More specifically, if the output signal b of the output control circuit 12 is at the "L" level, the output signal c of the NAND circuit 14 is fixed at the "H" level, irrespective of whether the output signal a of the signal source 10 is at the "H" or "L" level, so that the p channel MOS transistor Q1 is always turned off. In addition, the output signal $d_2$ of the NOR circuit 15 is fixed at the "L" level, so that the n channel MOS transistor Q2 is always turned off. Thus, when the output signal b of the output control circuit 12 is at the "L" level, an output data signal $e_2$ is not outputted from the output terminal 17.

Then, it is assumed that the output signal b of the output control circuit 12 is at the "H" level. In this case, if the output signal a of the signal source 10 is at the "H" level, the output signal c of the NAND circuit 14 attains the "L" level, so that the p channel MOS transistor Q1 is turned on. In addition, the output signal $d_2$ of the NOR circuit 15 is at the "L" level, so that the n channel MOS transistor Q2 is turned off. Thus, in this case, the output data signal $e_2$ of the "H" level is outputted from the output terminal 17. On the other hand, if the output signal a of the signal source 10 is at the "L" level, the output signal c of the NAND circuit 14 attains the "H" level, so that the p channel MOS transistor Q1 is turned off. In addition, the output signal $d_2$ of the NOR circuit 15 attains the "H" level, so that the n channel MOS transistor Q2 is turned on. Thus, in such a case, the output data signal $e_2$ of the "L" level is outputted from the output terminal 17.

FIG. 2 illustrates a waveform for explaining the operation of the output buffer circuit 11 to occur when the output signal b of the output control circuit 12 shown in FIG. 1 is at the "H" level.

It is assumed that the output signal a of the signal source 10 is changed from the "H" level to the the "L" level as shown in FIG. 2(1). In this case, the output signal $d_2$ of the NOR circuit 15 is changed from the "L" level to the "H" level as shown in FIG. 2(2). The output signal $e_2$ is responsively changed from the "H" level to the "L" level during the time period $t_2$ as shown in FIG. 2(3).

Meanwhile, large output capacitance C is parasitically connected to the output terminal 17 as described above. Consequently, when the output data signal $e_2$ is changed from the "H" level to the "L" level, excessive discharge current $i_2$ as shown in FIG. 2(4) flows to ground through the n channel MOS transistor Q2. As obvious from FIG. 2(4), when the potential difference between a source and a drain of the n channel MOS transistor Q2 is large, i.e., when the output data signal $e_2$ starts to be inverted, the discharge current $i_2$ rapidly flows. However, there exists a resistance component $R_1$ and an inductance component $L_1$ between the ground potential GND1 in the semiconductor device 110 and the ground potential GND2 in the system in which such semiconductor device 110 is included as described above, so that the ground potential GND1 in the semiconductor device 110 rises by a voltage $V_2$ with respect to the ground potential GND2 in the system as shown in FIGS. 2(5) and 2(6), when the discharge current $i_2$ flows. This voltage $V_2$ can be expressed as follows:

$$V_2 = i_2 R_1 + \frac{di_2}{dt} L_1 \tag{1}$$

As obvious from this equation (1), the larger the discharge current $i_2$ becomes and the larger the value of $di_2/dt$ becomes, the higher the ground potential GND1 rises. Since the current is expressed as follows:

$$i = \frac{dQ}{dt} = C \frac{dV}{dt}, \tag{2}$$

the larger the parasitic capacitance C coupled to the output terminal 17 shown in FIG. 1 becomes, the more the discharge current $i_2$ flows and the larger the rise $V_2$ of the ground potential GND1 becomes. In addition, the steeper the current $i_2$ changes, the larger the value of $di_2/dt$ becomes, so that the rise $V_2$ of the ground potential GND1 is particularly large when the output data signal $e_2$ starts to be inverted. As a result, output noise is produced due to such rise $V_2$ of the ground potential in the conventional output buffer circuit of the semiconductor device 110. More specifically, if it is assumed that the ground potential GND1 in the semiconductor device 110 temporarily rises by the voltage $V_2$ as described above, an input level to the semiconductor device 110 temporarily falls by $V_2$ from the true level with respect to the semiconductor device 110. If such fall of the ground potential is in excess of a determination level of an input circuit, this means that false data is inputted to the semiconductor device 110, resulting in malfunction of the whole device.

On the other hand, in the conventional semiconductor circuit for driving a TTL circuit, an RC circuit (not shown) is connected to the gate of the n channel MOS transistor $Q_2$ at the side of the ground potential in order to obtain a large fan out. As a result, the gate potential of the n channel MOS transistor $Q_2$ rises gently, so that steep discharge current $i_2$ can be controlled. However, such slow rising of the gate potential of the n channel MOS transistor $Q_2$ necessarily causes delay of an output data speed, and therefore, such circuit structure is unsuitable for a semiconductor device such as a dynamic RAM in which a high output data speed is required.

SUMMARY OF THE INVENTION

One object of the present invention is to provide an output buffer circuit for a semiconductor device wherein output noise is reduced.

Another object of the present invention is to provide an output buffer circuit for a semiconductor device wherein substrate capacitance is discharged in controlled manner.

Further object of the present invention is to provide an output buffer circuit for a semiconductor device wherein output noise is reduced without delaying data output rate.

Additional object of the present invention is to provide a method of circuitry for buffering output data of a semiconductor circuit such as memory wherein output noise is reduced without delaying data output rate.

Briefly stated, an output buffer circuit in a semiconductor device according to the present invention comprises output driving means formed by two semiconductor switching devices of conductivity types opposite to each other connected in series between a first voltage source of a high potential and a second voltage source of a low potential and responsive to a logical output of the semiconductor device for applying an output signal of a high potential or a low potential, and is adapted such that current flowing through a device connected to the second voltage source of a low potential out of the two semiconductor switching devices is controlled in response to the level of the output signal.

In accordance with another aspect of the present invention, a method of reducing electric noise generated by the output buffer circuit for the semiconductor device comprises the steps of measuring the level of the output signal and, in response, controlling current flowing through the semiconductor switching device connected to the second voltage source of a low potential.

Thus, a principal advantage of the present invention is that since an output buffer circuit in a semiconductor device is adapted such that current flowing through a device connected to a voltage source of a low potential out of two semiconductor switching devices constituting an output driving circuit is controlled in response to an output data signal, rapid flow of discharge current from output capacitance to ground can be suppressed and the rise of a ground potential can be controlled.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
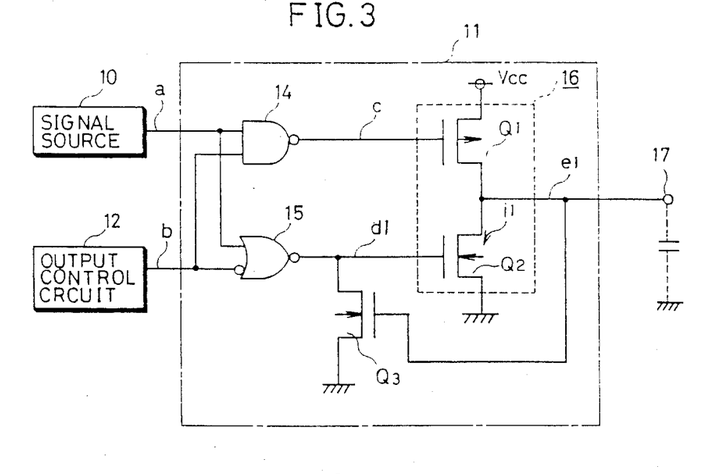
FIG. 3 is a circuit diagram showing an output buffer circuit according to a first embodiment of the present invention.

FIG. 3 is a circuit diagram showing an output buffer circuit according to an embodiment of the present invention.

The circuit shown in FIG. 3 is the same as the conventional output buffer circuit shown in FIG. 1 except for the following. More specifically, there is provided an n channel MOS transistor Q3 having its source connected to a ground potential, its drain connected to an output of a NOR circuit 15 and its gate connected to an output terminal 17. It is assumed that the NOR circuit 15 comprises a p channel MOS transistor (not shown). It is also assumed that transconductance of the n channel MOS transistor Q3 is smaller than that of the p channel MOS transistor (not shown) constituting the NOR circuit 15. More specifically, the actual size w of the n channel MOS transistor Q3 may be approximately 22 μm. In addition, it is assumed that transconductance of an n channel MOS transistor Q2 constituting an output driving circuit 16 is set larger than, for example, 1.5 times that of the conventional n channel MOS transistor Q2. More specifically, the actual size w of the p channel MOS transistor Q1 may be approximately 300 μm while that of the n channel MOS transistor Q2 may be approximately 350 μm.

Figure 4:
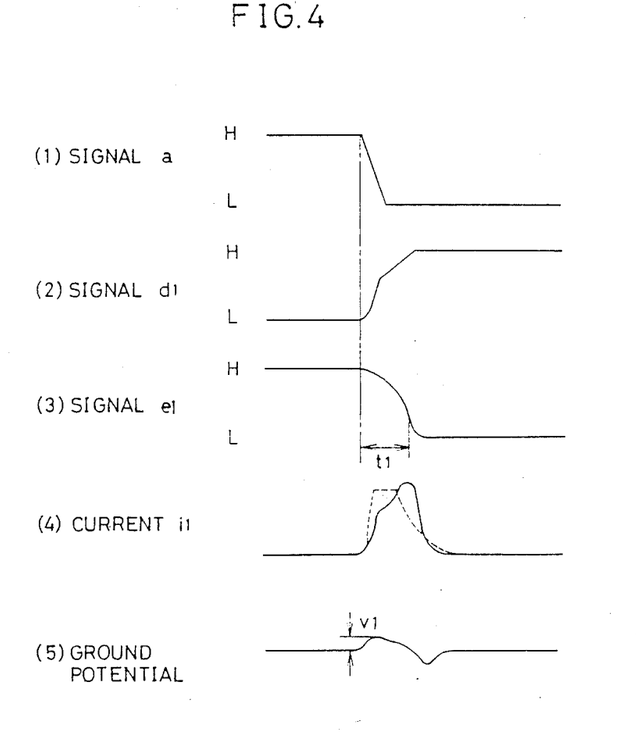
FIG. 4 is a waveform diagram for explaining an operation of the output buffer circuit shown in FIG. 3.

FIG. 4 is a waveform diagram for explaining an operation of the output buffer circuit according to an embodiment of the present invention shown in FIG. 3.

If an output signal b of an output control circuit 12 is at an "L" level, outputs of a NAND circuit 14 and the NOR circuit 15 are fixed at "H" and "L" levels, respectively, irrespective of whether an output signal a of a signal source 10 is at the "H" or "L" level, so that a p channel MOS transistor Q1 and the n channel MOS transistor Q2 are turned off, as in the conventional example shown in FIG. 1. Thus, an output data signal $e_1$ is not outputted from the output terminal 17. In this case, an output $d_1$ of the NOR circuit 15 is at the "L" level. Thus, both the source and the drain of the n channel MOS transistor Q3 are zero potentials, so that no current flows through the n channel MOS transistor Q3 irrespective of the gate potential thereof.

Description is now made on a case (see FIG. 4) in which the output signal b of the output control circuit 12 is at the "H" level.

It is assumed that the output signal a of the signal source 10 is changed from the "H" level to the "L" level as shown in FIG. 4(1). When the output signal a of the signal source 10 is at the "H" level, both the outputs of the NAND circuit 14 and the NOR circuit 15 attain the "L" level, so that the p channel MOS transistor Q1 is turned on and the n channel MOS transistor Q2 is turned off. Thus, in this case, the output data signal $e_1$ of the "H" level is outputted from the output terminal 17, as shown in FIG. 4(3). In this case, since a gate input of the n channel MOS transistor Q3 is at the "H" level, the transistor Q3 is turned on. Thus, connection between the output of the NOR circuit 15 and the ground is rendered electrically conductive. In such a state, when the output signal a of the signal source 10 is changed from the "H" level to the "L" level as shown in FIG. 4(1), the output signal $d_1$ of the NOR circuit 15 attempts to rise from the "L" level to the "H" level. However, since the n channel MOS transistor Q3 is turned on as described above, the signal $d_1$ rises more slowly, as compared with the signal $d_2$ (in FIG. 2(2)) in the conventional example. Thus, the output signal $e_1$ (in FIG. 4(3)) starts to fall slowly, as compared with the output signal $e_2$ (in FIG. 2(3)) in the conventional example. However, since transconductance of the n channel MOS transistor Q2 in the output driving circuit 16 is set larger than (for example, 1.5 times) that in the conventional example shown in FIG. 1, the output data signal $e_1$ falls rapidly from halfway. Thus, the time period $t_1$ (in FIG. 4(3)) required until the output data signal $e_1$ finally attains the "L" level is the same as the time period $t_2$ (in FIG. 2(3)) in the conventional example. In other words, the output speed of data in the present embodiment is held equal to that in the conventional example, which means no delay.

Furthermore, discharge current $i_1$ (in FIG. 4(4)) flowing through the n channel MOS transistor Q2 when the output data signal $e_1$ is inverted from the "H" level to the "L" level does not rise rapidly unlike the current $i_2$ in the conventional example (represented by a dotted line in FIG. 4(4)) but rises gently (represented by a solid line in FIG. 4(4)) because the signal $e_1$ first falls slowly. Thus, a ground potential $V_1$ (in FIG. 4(5)) which rises by the discharge current $i_1$ is controlled to be lower than the potential $V_2$ (in FIG. 2(5)) in the conventional example. More specifically, according to the embodiment shown in FIG. 3, the output speed of data is never slowed down while the output noise is reduced.

Figure 5:
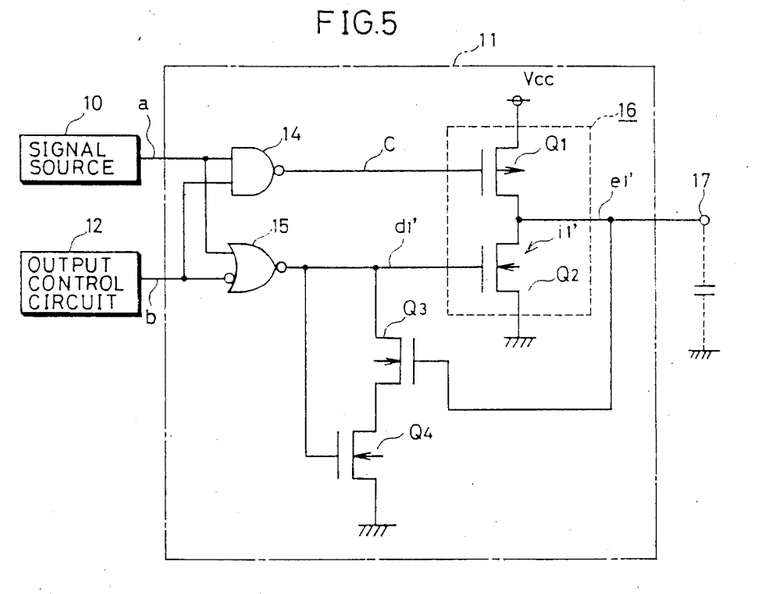
FIG. 5 is a circuit diagram showing an output buffer circuit according to a second embodiment of the present invention.
Figure 6:
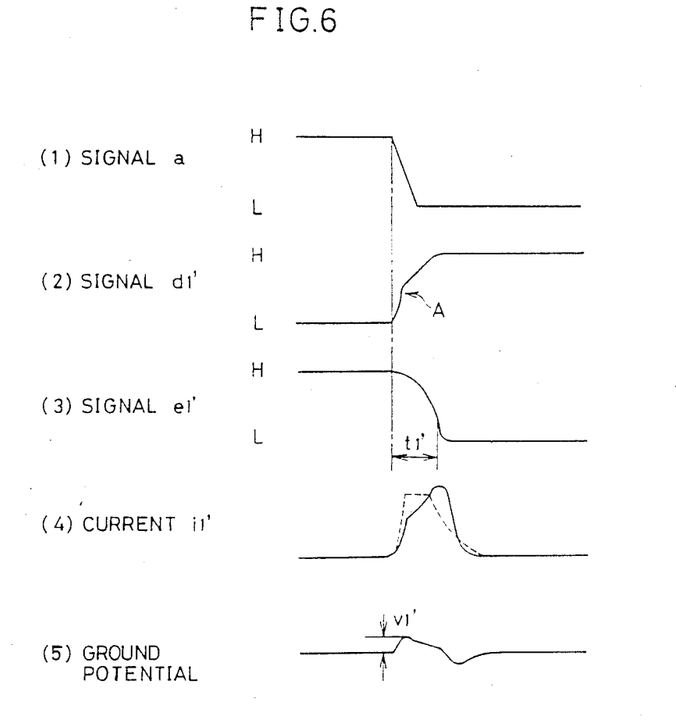
FIG. 6 is a waveform diagram for explaining an operation of the output buffer circuit shown in FIG. 5.

FIG. 5 is a circuit diagram showing an improved output buffer circuit according to a second embodiment of the present invention wherein the output data speed is increased, and FIG. 6 is a waveform diagram for explaining an operation thereof.

The circuit shown in FIG. 5 is the same as that according to the first embodiment shown in FIG. 3 except for the following. More specifically, there is provided an n channel MOS transistor Q4 having its source connected to a ground potential, its drain connected to a source of an n channel MOS transistor Q3 and its gate connected to an output of a NOR circuit 15.

According to a second embodiment shown in FIG. 5, when an output signal b of an output control circuit 12 is at an "H" level and an output signal a of a signal source 10 is also at the "H" level, an output signal $d_1'$ of the NOR circuit 15 is at an "L" level. Thus, an output data signal $e_1'$ is at the "H" level. In this case, a gate input of the n channel MOS transistor Q3 is at the "H" level, so that the transistor Q3 is turned on, as in the first embodiment shown in FIG. 3. However, the gate input $d_1'$ of the n channel MOS transistor Q4 is at the "L" level, so that the transistor Q4 is turned off. Thus, the source of the n channel MOS transistor Q3 and the ground are isolated. Therefore, as shown in FIG. 6(1), if the output signal a of the signal source 10 is changed from the "H" level to the "L" level so that the output signal $d_1'$ of the NOR circuit 15 rises from the "L" level to the "H" level, no current first flows through the n channel MOS transistor Q3, so that the output signal $d_1'$ of the NOR circuit 15 rises earlier, as compared with the signal $d_1$ (in FIG. 4(2)) in the first embodiment, in a portion represented by an arrow A in FIG. 6(2). Thereafter, a gate potential of the n channel MOS transistor Q4 rises, so that the transistor Q4 is turned on. Consequently, the signal $d_1'$ rises in the same manner as the signal $d_1$ shown in FIG. 4(2).

More specifically, according to the second embodiment shown in FIG. 5, the time period $t_1'$ required until the output data signal $e_1'$ attains the "L" level is slightly shorter than the time period $t_1$ in the first embodiment shown in FIG. 3, so that the output speed of data is increased. However, a ground potential $V_1'$ (in FIG. 6(5)) which rises by discharge current $i_1'$ (in FIG. 6(4)) is slightly larger than the potential $V_1$ (in FIG. 4(5)) in the first embodiment.

Figure 7:
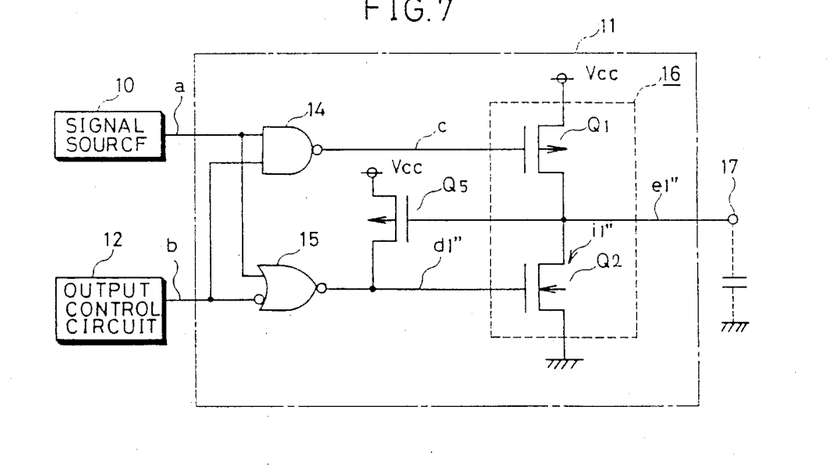
FIG. 7 is a circuit diagram showing an output buffer circuit according to a third embodiment of the present invention.
Figure 8:
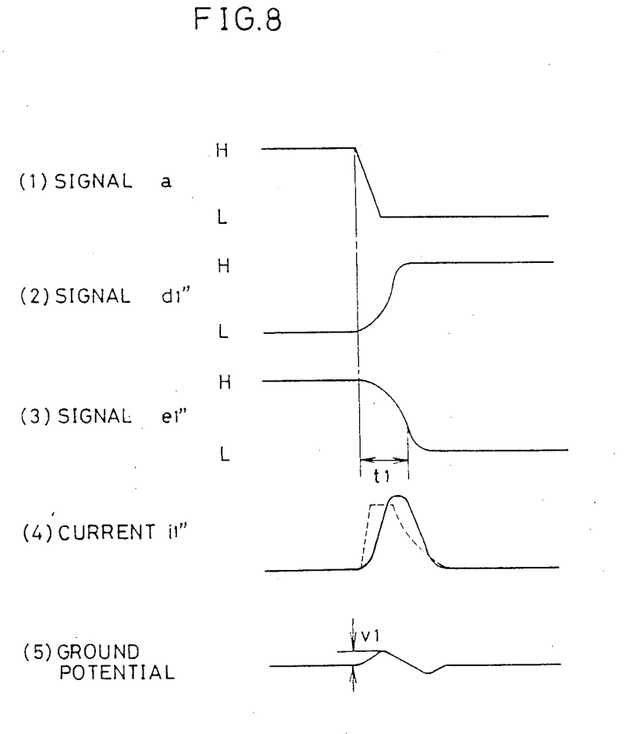
FIG. 8 is a waveform diagram for explaining an operation of the output buffer circuit shown in FIG. 7.

FIG. 7 is a circuit diagram showing an improved output buffer circuit according to a third embodiment of the present invention wherein output noise can be reduced, and FIG. 8 is a waveform diagram for explaining an operation thereof.

The circuit shown in FIG. 7 is the same as the conventional output buffer circuit shown in FIG. 1 except for the following. More specifically, there is provided a p channel MOS transistor Q5 having its source connected to a power-supply voltage $V_{CC}$, its drain connected to an output of a NOR circuit 15 and its gate connected to an output terminal 17. It is assumed that transconductance of a p channel MOS transistor (not shown) constituting the NOR circuit 15 is set smaller than that in the conventional example.

According to the embodiment shown in FIG. 7, when an output signal b of an output control circuit 12 is at an "H" level and an output signal a of a signal source 10 is also at the "H" level, an output signal $d_1'$ of the NOR circuit 15 is at an "L" level. Thus, an output data signal $e_1''$ is at the "H" level. In this case, a gate input of the p channel MOS transistor Q5 is at the "H" level, so that the transistor Q5 is turned off. Thus, an output of the NOR circuit 15 and a power-supply voltage $V_{CC}$ are isolated. In such a state, when the output signal a of the signal source 10 is changed from the "H" level to the "L" level as shown in FIG. 8(1), the output signal $d_1''$ of the NOR circuit 15 attempts to rise from the "L" level to the "H" level. However, since transconductance of a p channel MOS transistor (not shown) in the NOR circuit 15 is set small as described above, the signal $d_1''$ rises more slowly, as compared with the signal $d_2$ (in FIG. 2(2)) in the conventional example, as shown in FIG. 8(2). Thus, the output data signal $e_1''$ (in FIG. 8(3)) first falls more slowly, as compared with the output signal $e_2$ (in FIG. 2(3)) in the conventional example. However, thereafter, a gate potential of the p channel MOS transistor Q5 falls, so that the transistor Q5 is turned on. Consequently, the power-supply voltage $V_{CC}$ is applied to the output signal $d_1''$ of the NOR circuit 15, so that the signal $d_1''$ rises rapidly from halfway. Thus, the output data signal $e_1''$ falls rapidly from halfway. Therefore, the time period $t_1$ (in FIG. 8(3)) required until the output data signal $e_1''$ finally attains the "L" level is the same as that in the first embodiment shown in FIG. 4. More specifically, according to the third embodiment, the output speed of data is held equal to that in the conventional example.

Additionally, discharge current $i_1''$ (in FIG. 8(4)) flowing through an n channel MOS transistor Q2 when the output data signal $e_1''$ is inverted from the "H" level to the "L" level does not rise rapidly unlike the discharge current $i_2$ (represented by a dotted line in FIG. 8(4)) in the conventional example but rises slowly (represented by a solid line in FIG. 8(4)) because the signal $e_1''$ first falls slowly. Thus, a ground potential $V_1$ (in FIG. 8(5)) which rises by the discharge current $i_1''$ is the same as that in the first embodiment shown in FIG. 4. Consequently, the ground potential $V_1$ is controlled to be lower than the potential $V_2$ (in FIG. 2(5)) in the conventional example, so that output noise can be reduced.

However, in the output buffer circuit shown in FIG. 7, when the output signal b of the output control circuit 12 is at the "L" level, the output signal c of the NAND circuit 14 is fixed at the "H" level while the output signal $d_1''$ of the NOR circuit 15 is fixed at the "L" level irrespective of whether the output signal a of the signal source 10 is at the "H" level or "L" level as described above. As a result, both MOS transistors Q1 and Q2 are in an off state, so that the output terminal 17 is in a high impedance state. In such a state, there is a possibility that the MOS transistor Q5 is accidentally turned on because the MOS transistor Q5 receives the output level of the output terminal 17 as its gate input. Consequently, current is liable to flow from the power supply $V_{CC}$ through the transistor Q5.

Figure 9:
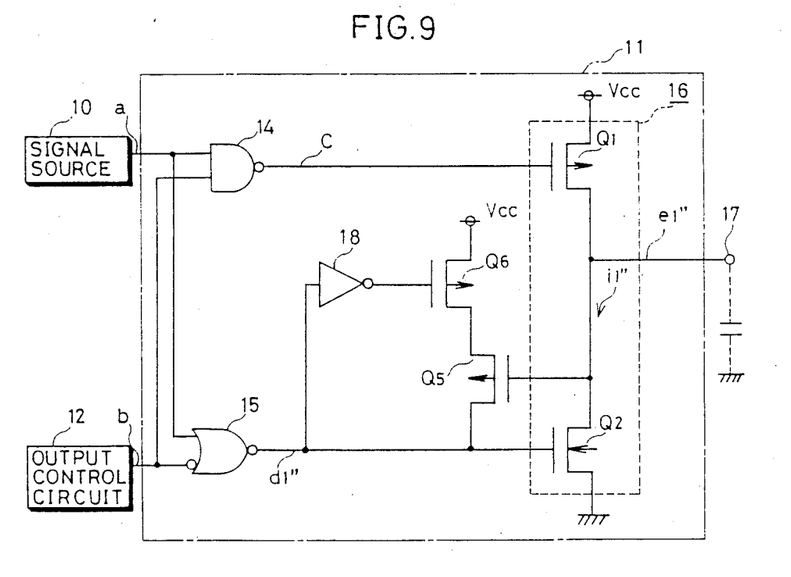
FIG. 9 is a circuit diagram showing an output buffer circuit according to a fourth embodiment of the present invention.

FIG. 9 is a circuit diagram showing an example of an improved output buffer circuit capable of preventing such a state.

The circuit according to a fourth embodiment shown in FIG. 9 is the same as that according to the third embodiment shown in FIG. 7 except for the following. More specifically, there is provided an inverter 18 for inverting an output of a NOR circuit 15 and a p channel MOS transistor Q6 having its source connected to a power-supply voltage $V_{CC}$, its drain connected to a source of a p channel MOS transistor Q5 and its gate connected to an output of the inverter 18.

According to the fourth embodiment shown in FIG. 9, when an output signal $d_1''$ of the NOR circuit 15 is at an "L" level, a signal of an "H" level is applied to the gate of the p channel MOS transistor Q6 by the inverter 18, so that the MOS transistor Q6 is turned off. Thus, the power-supply voltage $V_{CC}$ and the source of the p channel MOS transistor Q5 are isolated irrespective of a potential of an output terminal 17, so that no current flows from the power-supply $V_{CC}$. Only when the output signal $d_1''$ of the NOR circuit 15 is changed from the "L" level to the "H" level so that an output of the inverter 18 attains the "L" level, the p channel MOS transistor Q6 is turned on and the power-supply voltage $V_{CC}$ is supplied to the transistor Q5. Consequently, the same function as that in the third embodiment shown in FIG. 7 is achieved. A waveform diagram for explaining an operation in the fourth embodiment is the same as that in the third embodiment shown in FIG. 8 and hence, omitted. More specifically, according to the fourth embodiment, output noise can be reduced without slowing down the output speed of data.

Figure 10:
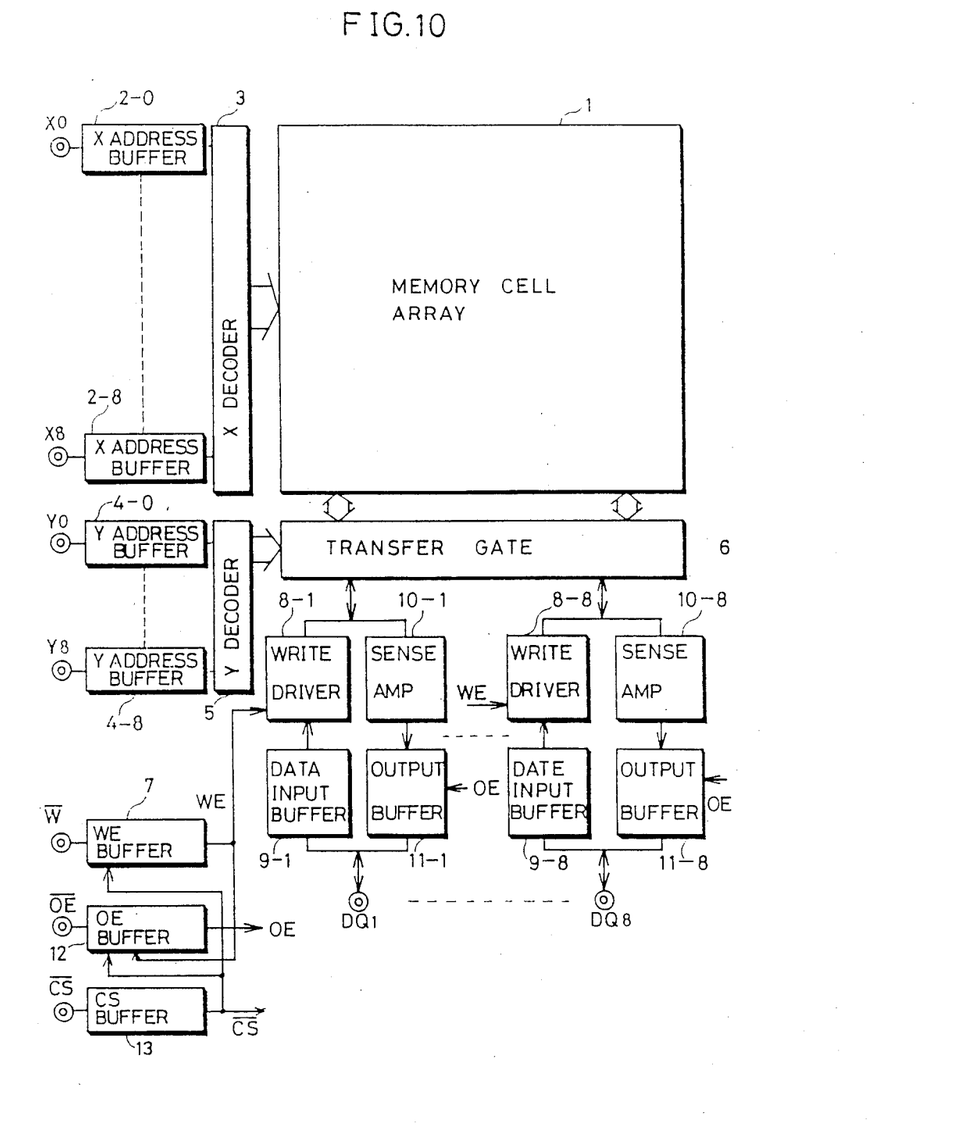
FIG. 10 is a schematic block diagram showing an example of structure of a semiconductor memory device to which the present invention is applicable.

FIG. 10 is a schematic block diagram showing an example of a structure of a conventional semiconductor memory device to which the present invention is applicable. In FIG. 10, a memory cell array 1 has a plurality of word lines and a plurality of bit lines arranged intersecting with each other, a memory cell being provided at each of intersections of the bit lines and the word lines. The memory cell is selected on the basic of an intersection of a single word line selected by X address buffers 2-0, ..., 2-8 and an X decoder 3 and a signal bit line selected by Y address buffers 4-0, ..., 4-8 and a Y decoder 5. Data is written or read out to or from the selected memory cell through a transfer gate 6. At the time of writing data, write drivers 8-1, ..., 8-8 are driven by a control signal WE outputted from a WE buffer 7 in response to an external signal $\overline{W}$, and input data from data input buffers 9-1, ..., 9-8 are applied to the transfer gate 6. At the time of reading out data, data outputted through the transfer gate 6 is sensed and amplified by sense amplifiers 10-1, ..., 10-8 and then, applied to output buffer circuits 10-1, ..., 10-8. Each of the output buffer circuits 11-1, ..., 11-8 is driven by a control signal OE outputted from an output control circuit (OE buffer 12) in response to an external signal $\overline{OE}$ and the control signal WE, to generate output data. A CS buffer 13 is responsive to a chip selecting signal $\overline{CS}$ externally applied for driving the WE buffer 7 an the OE buffer 12. The output buffer circuit 11 in the above described embodiments corresponds to each of the output buffer circuits 11-1, ..., 11-8 shown in FIG. 10, the signal source 10 in the embodiments corresponds to each of the sense amplifiers 10-1, ..., 10-8 shown in FIG. 10, and the output control circuit 12 in the embodiments corresponds to the OE buffer 12 shown in FIG. 10. As a result, in the semiconductor memory device such as a dynamic RAM as shown in FIG. 10, output noise can be reduced without delaying the output data from the semiconductor memory device.

As described in the foregoing, according to the embodiments of the present invention, an output driving circuit comprises two semiconductor switching devices which are connected in series between a voltage source of a high potential and a voltage source of a low potential and current flowing through the device connected to the voltage source of a low potential is controlled in response to an output signal, so that output noise can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output buffer circuit for a semiconductor device, comprising:
   output driving means responsive to first and second logical signals supplied from said semiconductor device for supplying an output signal of either a first level of a high potential or a second level of a low potential,
   said output driving means comprising
   (a) a first voltage source of said first level,
   (b) a second voltage source of said second level,
   (c) an output terminal for supplying said output signal,
   (d) a first semiconductor switching device of a first conductivity type having a conductive path connected between said first voltage source and said output terminal and a control terminal receiving said first logical signal, and
   (e) a second semiconductor switching device of a second conductivity type having a conductive path connected between said second voltage source and said output terminal and a control terminal receiving said second logical signal, and
   means responsive to the level of the output signal in said output terminal for controlling current flowing through the conductive path in said second semiconductor switching device, wherein
   said current control means comprises means for controlling said second logical signal applied to the control terminal of said second switching device when the level of the output signal at said output terminal is switched from said first level to said second level,
   said means for controlling said second logical signal comprises a third semiconductor switching device of the second conductivity type having a conductive path connected between the control terminal of said second semiconductor switching device and said second voltage source and a control terminal connected to said output terminal, and
   said means for controlling said second logical signal further comprises a fourth semiconductor switching device of the second conductivity type having a conductive path connected between the conductive path of said third semiconductor switching device and said second voltage source and a control terminal receiving said second logical signal.

2. An output buffer circuit according to claim 1, wherein
   said second level is a ground potential.

3. An output buffer circuit according to claim 1, wherein
   said semiconductor switching device of the first conductivity type is a p channel MOS transistor, and
   said semiconductor switching device of the second conductivity type is an n channel MOS transistor.

4. An output buffer circuit for a semiconductor device, comprising:
   output driving means responsive to first and second logical signals supplied from said semiconductor device for supplying an output signal of either a first level of a high potential or a second level of a low potential,
   said output driving means comprising
   (a) a first voltage source of said first level,
   (b) a second voltage source of said second level,
   (c) an output terminal for supplying said output signal,
   (d) a first semiconductor switching device of a first conductivity type having a conductive path connected between said first voltage source and said output terminal and a control terminal receiving said first logical signal, and
   (e) a second semiconductor switching device of a second conductivity type having a conductive path connected between said second voltage source and said output terminal and a control terminal receiving said second logical signal, and
   means responsive to the level of the output signal in said output terminal for controlling current flowing through the conductive path in said second semiconductor switching device, wherein
   said current control means comprises means for controlling said second logical signal applied to the control terminal of said second switching device when the level of the output signal at said output terminal is switched from said first level to said second level, and
   said means for controlling said second logical signal comprises a third semiconductor switching device of the first conductivity type having a conductive path connected between the control terminal of said second semiconductor switching device and said first voltage source and a control terminal connected to said output terminal.

5. An output buffer circuit according to claim 4, wherein said means for controlling said second logical signal further comprises
   means for inverting said second logical signal, and
   a fourth semiconductor switching device of the first conductivity type having a conductive path connected between the conductive path of said third semiconductor switching device and said first voltage source and a control terminal receiving said second logical signal inverted by said inverting means.

6. An output buffer circuit for a semiconductor device, comprising:
   output driving means responsive to first and second logical signals supplied from said semiconductor device for supplying an output signal of either a first level of a high potential or a second level of a low potential, said output driving means comprising
   (a) a first voltage source of said first level,
   (b) a second voltage source of said second level,
   (c) an output terminal for supplying said output signal,
   (d) a first semiconductor switching device of a first conductivity type having a conductive path connected between said first voltage source and said output terminal and a control terminal receiving said first logical signal, an d
   (e) a second semiconductor switching device of a second conductivity type having a conductive path connected between said second voltage source and said output terminal and a control terminal receiving said second logical signal, and
means responsive to the level of the output signal in said output terminal for controlling current flowing through the conductive path in said second semiconductor switching device, wherein
transconductance of said second semiconductor switching device is set larger than that of said first semiconductor switching device.

7. An output buffer circuit according to claim 6, wherein
transconductance of said second semiconductor switching device is set approximately 1.5 times that of said first semiconductor switching device.

8. An output buffer circuit for a semiconductor memory device including a sense amplifier for supplying first logical signals representing data read from said memory device and an output control circuit for supplying second logical signals from said memory device, comprising:
output driving means responsive to first and second logical signal supplied from said semiconductor memory device for supplying an output signal of either a first level of a high potential or a second level of a low potential,
said output driving means comprising
   (a) a first voltage source of said first level,
   (b) a second voltage source of said second level,
   (c) an output terminal for supplying said output signal,
   (d) a first semiconductor switching device of a first conductivity type having a conductive path connected between said first voltage source and said output terminal and a control terminal receiving said first logical signal, and
   (e) a second semiconductor switching device of a second conductivity type having a conductive path connected between said second voltage source and said output terminal and a control terminal receiving said second logical signal, and
means responsive to the level of the output signal in said output terminal for controlling current flowing through the conductive path in said second semiconductor switching device, wherein
said current control means comprises means for controlling said second logical signal applied to the control terminal of said second switching device when the level of the output signal at said output terminal is switched from said first level to said second level,
said means for controlling said second logical signal comprises a third semiconductor switching device of the second conductivity type having a conductive path connected between the control terminal of said second semiconductor switching device and said second voltage source and a control terminal connected to said output terminal, and
said means for controlling said second logical signal further comprises a fourth semiconductor switching device of the second conductivity type having a conducting path connected between the conductive path of said third semiconductor switching device and said second voltage source and a control terminal receiving said second logical signal.

9. An output buffer circuit according to claim 8, wherein
said second level is a ground potential.

10. An output buffer circuit according to claim 8, wherein
said semiconductor switching device of the first conductivity type is a p channel MOS transistor, and
said semiconductor switching device of the second conductivity type is an n channel MOS transistor.

11. An output buffer circuit for a semiconductor memory device including a sense amplifier for supplying first logical signals representing data read from said memory device and an output control circuit for supplying second logical signals from said memory device, comprising:
output driving means responsive to first and second logical signals supplied from said semiconductor memory device for supplying an output signal of either a first level of a high potential or a second level of a low potential,
said output driving means comprising
   (a) a first voltage source of said first level,
   (b) a second voltage source of said second level,
   (c) an output terminal for supplying said output signal,
   (d) a first semiconductor switching device of a first conductivity type having a conductive path connected between said first voltage source and said output terminal and a control terminal receiving said first logical signal, and
   (e) a second semiconductor switching device of a second conductivity type having a conductive path connected between said second voltage source and said output terminal and a control terminal receiving said second logical signal, and
means responsive to the level of the output signal in said output terminal for controlling current flowing through the conductive path in said second semiconductor switching device, wherein,
said current control means comprises means for controlling said second logical signal applied to the control terminal of said second switching device when the level of the output signal at said output terminal is switched from said first level to said second level, and
said means for controlling said second logical signal comprises a third semiconductor switching device of the first conductivity type having a conductive path connected between the control terminal of said second semiconductor switching device and said first voltage source and a control terminal connected to said output terminal.

12. An output buffer circuit according to claim 11, wherein said means for controlling said second logical signal further comprises
means for inverting said second logical signal, and
a fourth semiconductor switching device of the first conductivity type having a conductive path connected between the conductive path of said third semiconductor switching device and said first voltage source and a control terminal receiving said second logical signal inverted by said inverting means.

13. An output buffer circuit for a semiconductor memory device including a sense amplifier for supplying first logical signals representing data read from said memory device and an output control circuit for supplying second logical signals from said memory device, comprising:

output driving means responsive to first and second logical signals supplied from said semiconductor memory device for supplying an output signal of either a first level of a high potential or a second level of a low potential, said output driving means comprising
- (a) a first voltage source of said first level,
- (b) a second voltage source of said second level,
- (c) an output terminal for supplying said output signal,
- (d) a first semiconductor switching device of a first conductivity type having a conductive path connected between said first voltage source and said output terminal and a control terminal receiving said first logical signal, and
- (e) a second semiconductor switching device of a second conductivity type having a conductive path connected between said second voltage source and said output terminal and a control terminal receiving said second logical signal, and means responsive to the level of the output signal in said output terminal for controlling current flowing through the conductive path in said second semiconductor switching device, wherein transconductance of said second semiconductor switching device is set larger than that of said first semiconductor switching device.

14. An output buffer circuit according to claim 13, wherein transconductance of said second semiconductor switching device is set approximately 1.5 times that of said first semiconductor switching device.

* * * * *

UNITED STATES PATENT AND TRADEMARK OFFICE
CERTIFICATE OF CORRECTION

PATENT NO. : 4,985,644

DATED : January 15, 1991

INVENTOR(S) : Yoshihiko OKIHARA, Yutaka ARITA

It is certified that error appears in the above-identified patent and that said Letters Patent is hereby corrected as shown below:

ON TITLE PAGE:

Please correct item [54] to read as follows:

--[54] OUTPUT BUFFER SEMICONDUCTOR CIRCUIT AND METHOD FOR CONTROLLING CURRENT FLOW IN AN OUTPUT SWITCHING DEVICE--

Signed and Sealed this

Second Day of June, 1992

Attest:

DOUGLAS B. COMER

Attesting Officer

Acting Commissioner of Patents and Trademarks